(12) United States Patent
Liu et al.

(10) Patent No.: US 7,202,130 B2
(45) Date of Patent: Apr. 10, 2007

(54) SPACER FOR A SPLIT GATE FLASH MEMORY CELL AND A MEMORY CELL EMPLOYING THE SAME

(75) Inventors: Yuan-Hung Liu, Hsin-Chu (TW); Chih-Ta Wu, Hsin-Chu (TW); Yeur-Luen Tu, Taichung (TW); Chi-Hsin Lo, Hsin-Chu (TW); Chia-Shiung Tsai, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 11 days.

(21) Appl. No.: 10/775,290

(22) Filed: Feb. 10, 2004

(65) Prior Publication Data

US 2005/0176201 A1 Aug. 11, 2005

(51) Int. Cl.
  *H01L 21/336* (2006.01)
  *H01L 29/788* (2006.01)
(52) U.S. Cl. ...................... 438/261; 257/317
(58) Field of Classification Search ........ 257/314–319, 257/354; 438/257–262, 303, 304
See application file for complete search history.

(56) References Cited

U.S. PATENT DOCUMENTS

| | | | | |
|---|---|---|---|---|
| 5,879,992 A | * | 3/1999 | Hsieh et al. ................. | 438/264 |
| 6,063,657 A | * | 5/2000 | Bronner et al. .............. | 438/244 |
| 6,153,904 A | | 11/2000 | Yang | |
| 6,165,843 A | * | 12/2000 | Sung ........................... | 438/258 |
| 6,645,869 B1 | | 11/2003 | Chu et al. | |
| 6,790,123 B2 | * | 9/2004 | Korovin et al. ................. | 451/5 |
| 6,875,658 B2 | * | 4/2005 | Yang ........................... | 438/275 |
| 2002/0093044 A1 | * | 7/2002 | Hsieh et al. .................. | 257/315 |
| 2003/0181053 A1 | * | 9/2003 | Tseng et al. ................. | 438/694 |
| 2005/0136676 A1 | * | 6/2005 | Liu ............................. | 438/703 |

* cited by examiner

*Primary Examiner*—Calvin Lee
(74) *Attorney, Agent, or Firm*—Slater & Matsil, L.L.P.

(57) ABSTRACT

A spacer, a split gate flash memory cell, and related method of forming the same. In one aspect, a composite spacer includes a first spacer insulating layer having a first deposition distribution that varies as a function of a location on a substrate. The composite spacer also includes a second spacer insulating layer having a second deposition distribution that varies in substantial opposition to the first deposition distribution. In another aspect, a composite spacer includes a first spacer insulating layer having a substantially uniform deposition distribution across a surface thereof. The composite spacer also includes a second spacer insulating layer having a varying deposition distribution with a thinner composition in selected regions of the memory cell. In another aspect, a coupling spacer provides for a conductive layer that extends between a floating gate and a substrate insulating layer adjacent a source recessed into the substrate of the memory cell.

50 Claims, 10 Drawing Sheets

SPACER FOR A SPLIT GATE FLASH MEMORY CELL AND A MEMORY CELL EMPLOYING THE SAME

TECHNICAL FIELD

The present invention is directed, in general, to semiconductor devices and, more specifically, to a spacer for a split gate flash memory cell, a split gate flash memory cell, and related method of forming the spacer and the split gate flash memory cell.

BACKGROUND

Complementary metal-oxide-semiconductor memory devices include random access memory and read only memory. The market share for read only memory has been continuously growing, especially in view of the development of flash memory in which a single cell can be electrically programmable and a block, sector or page of the cells may be simultaneously electrically erasable. Due to the electrically programmable but erasable characteristic of the flash memory, the market share of the flash memory as compared to electrically programmable read only memory has grown significantly. While electrically erasable and programmable read only memory is electrically erasable and programmable per single byte, the application is limited due to the excessive footprint and attendant costs thereof. In recent years, the flash memory has found interesting applications in consumer products such as digital cameras, digital video cameras, cellular telephones, laptop computers, and personal digital assistants. Since portability of the consumer products is often a prerequisite by consumers, a reduction in the size of the consumer products continues to be a hot button. As a result, the functionality and capacity of the flash memory should be augmented, while, at the same time, maintaining or, preferably, reducing the footprint of the flash memory.

A particular type of flash memory is a split gate flash memory cell. An example of a split gate flash memory cell is disclosed in U.S. Pat. No. 6,562,673 entitled "Method of Fabricating a Self-Aligned Split Gate Flash Memory Cell," to Lin, issued May 13, 2003, which is incorporated herein by reference. To better understand a design and construction of the split gate flash memory cell as well as selected limitations associated with the current state of the art, the processes employed to fabricate the memory cell of Lin will hereinafter be described.

Referring initially to FIG. 1 and at an interim step, an active region has been formed by a conventional local oxidation of silicon process or a shallow trench isolation process on a semiconductor substrate 100 (e.g., a p-type silicon substrate). Within the active region, a first gate insulating layer 110 having a thickness of 50 to 200 angstroms is formed on the substrate 100 by an oxidation process. Then, a first conductive layer 115 of doped polycrystalline silicon having a thickness of 1000 to 2000 angstroms is formed on the first gate insulating layer 110 by a chemical vapor deposition process. The first conductive layer 115 is typically doped by phosphorus ions or arsenic ions by diffusion, implantation or in-situ doping. Thereafter, a first buffer layer 120 of nitride having a thickness of 1000 to 2000 angstroms is formed on the first conductive layer 115 by a low pressure chemical vapor deposition process.

Turning now to FIG. 2, a photolithography and etching process is performed on the first buffer layer 120. In accordance therewith, a portion of the first buffer layer 120 is removed to form a first opening 122. An insulating layer (not shown) of oxide having a thickness of 500 to 2000 angstroms is formed on the first buffer layer 120 by a low pressure chemical vapor deposition process. The insulating layer extends to cover the side walls and bottom of the first opening 122. Then, an anisotropic etching process is performed, and the insulating layer on the surface of the first buffer layer 120 and on the bottom of the first opening 122 is removed to form first buffer spacers 126. In other words, the remaining portion of the insulating layer remaining on the side walls of the first opening 122 forms the first buffer spacers 126.

Turning now to FIG. 3, using the first buffer layer 120 and the first buffer spacers 126 as a mask, the first conductive layer 115 and the first gate insulating layer 110 underlying the first opening 122 are removed to form a second opening 128 by an anisotropic etching process. The second opening 128 includes the first opening 122 and is deeper than the first opening 122. Thereafter, another insulating layer (not shown) of nitride having a thickness of 100 to 300 angstroms is formed by a low pressure chemical vapor deposition process to cover the surface of the first buffer layer 120 and the first buffer spacers 126 and extends into the second opening 128 to cover the side walls and bottom thereof. Then, an anisotropic etching process is performed to remove the insulating layer on the first buffer layer 120 and the first buffer spacers 126, and on the bottom of the second opening 128. The portion of the insulating layer remaining on the side walls of the second opening 128 forms contact spacers 130. N-type impurity ions are then implanted through the second opening 128 into the substrate 100 to form a source 132.

Turning now to FIGS. 4 and 5, a second conductive layer 140 of doped polycrystalline silicon having a thickness of 1000 to 3000 angstroms is formed by a low pressure chemical vapor deposition process on the first buffer layer 120 and the first buffer spacers 126, and into the second opening 128. The second conductive layer 140 is typically doped by the phosphorus ions or arsenic ions by diffusion, implantation or in-situ doping. Thereafter and with reference to FIG. 5, the second conductive layer 140 on the first buffer layer 120 and the first buffer spacers 126 is removed by planarization such as a chemical mechanical polishing technique. The residual second conductive layer 140 remaining in the second opening 128 forms a contact plug 142. Then, the first buffer spacers 126 are removed by an isotropic etching process to form a third opening 146 and a portion of the surface of the first conductive layer 115 is exposed.

Turning now to FIGS. 6 and 7, the first conductive layer 115 at the bottom of the third opening 146 is oxidized via an oxidation process to form a first oxide layer 150. Additionally, the top surface of the contact plug 142 not covered by the contact spacers 130 is oxidized via an oxidation process to form a second oxide layer 153. Thereafter, a second buffer layer (not shown) of silicon oxide having a thickness of 500 to 2000 angstroms is formed by a low pressure chemical vapor deposition process on the first buffer layer 120 and the second oxide layer 153, and into the third opening 146. The second buffer layer located on the first buffer layer 120 and the second oxide layer 153 is removed by planarization such as a chemical mechanical polishing technique. Referring to FIG. 7, the portion of the second buffer layer remaining in the third opening 146 forms second buffer spacers 155. Then, the first buffer layer 120 is removed by an etching process to form a fourth opening 160.

Turning now to FIG. 8, the first conductive layer 115 and the first gate insulating layer 110 located beneath the bottom of the fourth opening 160 and not covered by the first oxide layer 150 are removed by an etching process. The remaining portion of the first conductive layer 115 forms floating gates 152 and the remaining portion of the first gate insulating layer 110 will hereinafter be referred to as a residual first gate insulating layer 110'. An insulating layer (not shown) of silicon oxide having a thickness of 50 to 150 angstroms is formed by an oxidation process over the substrate 100, the first oxide layer 150 overlying the floating gates 152, the second buffer spacers 155, and the second oxide layer 153. Then, another insulating layer of silicon oxide having a thickness of 50 to 150 angstroms is formed by a chemical vapor deposition process over the insulating layer (not shown, but discussed above). The two above referenced insulating layers combine to form a second gate insulating layer 165.

Turning now to FIG. 9, a conductive layer (not shown) of doped polycrystalline silicon having a thickness of 1000 to 2000 angstroms is formed by a low pressure chemical vapor deposition process on the second gate insulating layer 165. The conductive layer is typically doped with the phosphorus ions or arsenic ions by diffusion, implantation or in-situ doping. Then, an etching process is performed to remove the portions of the conductive layer on the second buffer spacers 155 and the second oxide layer 153. The conductive layer remaining on the side walls of the fourth opening 160 forms control gates 170. The etching process also removes the portion of the second gate insulating layer 165 located on the second buffer spacers 155, the second oxide layer 153, and portions of the substrate 100 not covered by the control gates 170. Then, an insulating layer (not shown) of oxide having a thickness of 500 to 2000 angstroms is formed by a low pressure chemical vapor deposition process on the second oxide layer 153, second buffer layers 155, second gate insulating layer 165, control gates 170, and the substrate 100. An anisotropic etching back process is performed to remove the insulating layer to form control gate spacers 175 on the side walls of the control gates 170. Finally, n-type impurity ions are implanted into the substrate 100 at the bottom of the fourth opening to form drains 180.

The aforementioned split gate flash memory cell by Lin and other related memory cells suffer from design and fabrication limitations that hinder the functionality and yield thereof. First of all, variations in critical dimensions of sections of the split gate flash memory cell may occur due to variations in material deposition processes (e.g., deposition distributions) and etch rates depending on a location of a particular memory cell on a semiconductor wafer or substrate. For instance, critical dimensions associated with a spacer (e.g., the second buffer layer 155 of Lin) of a split gate flash memory cell constructed proximate a center of the substrate may not be consistent with a like spacer of a split gate flash memory cell constructed toward an edge of the substrate, even when the same processes are applied to fabricate both cells. Thus, two split gate flash memory cells constructed according to the same processes may provide very different performance characteristics by virtue of the respective location on the substrate.

Additionally, over etching, if not kept in check, can deteriorate selected materials within the split gate flash memory cell thereby detracting from an integrity of the memory cell. This phenomena is especially important in narrow regions within the split gate flash memory cell wherein it is difficult to etch away unwanted materials without affecting the surrounding materials and, possibly, the underlying materials within the split gate flash memory cell. For instance and with reference to Lin, when the insulating layer at the bottom of the second opening 128 is removed by an anisotropic etching process in accordance with constructing the contact spacers 130 as discussed above, the width of the second opening 128 subject to the etching process is quite narrow. Of course, over etching is typically employed in such instances to ensure that the unwanted materials (in this instance, the insulating layer) are removed. Inasmuch as the over etching window (i.e., the second opening 128) is very narrow, it is not practical to reduce an over etching time to remove the insulating material thereby subjecting the other materials within the split gate flash memory cell from being erroneously etched away.

Finally, a low coupling efficiency between sections of the split gate flash memory cell can deter from a performance of the memory cell. As an example, a limited area or region of contact between the floating gate, source and common source line (or contact plug 142 as referred by Lin) can provide a low coupling efficiency within the split gate flash memory cell. Again, a low coupling efficiency between the floating gate and common source line may cause errors and, at the very least, inhibit the performance such as a programming speed of the split gate flash memory cell.

Accordingly, what is needed in the art is a split gate flash memory cell and related method of construction therefor that addresses the issues associated with non-uniform critical dimensions of the memory cells constructed across a substrate, over etching times within selecting regions of the memory cell, and low coupling efficiency between selected sections of the memory cell that overcomes the deficiencies in the prior art.

SUMMARY OF THE INVENTION

These and other problems are generally solved or circumvented, and technical advantages are generally achieved, by advantageous embodiments of the present invention which includes a composite spacer for use with a split gate flash memory cell on a substrate. In one embodiment, the composite spacer includes a first spacer insulating layer having a first deposition distribution that varies as a function of a location of the split gate flash memory cell on the substrate. The composite spacer also includes a second spacer insulating layer overlying the first spacer insulating layer and having a second deposition distribution that varies in substantial opposition to the first deposition distribution of the first spacer insulating layer as a function of the location of the split gate flash memory cell on the substrate.

In one advantageous embodiment, the composite spacer forms a composite floating gate spacer proximate a floating gate of the split gate flash memory cell. In related aspects, the present invention provides a method of forming the composite spacer, and a split gate flash memory cell employing the same. By virtue of employing multiple materials with substantially opposite deposition distributions, the composite spacer achieves a more uniform construction notwithstanding a location of the split gate flash memory cell on the substrate.

In another aspect, the present invention provides another composite spacer for use with a split gate flash memory cell on a substrate. In one embodiment, the composite spacer includes a first spacer insulating layer having a substantially uniform deposition distribution across a surface thereof. The composite spacer also includes a second spacer insulating layer overlying the first spacer insulating layer and having a varying deposition distribution across a surface thereof. The second spacer insulating layer has a thinner composition in selected regions of the split gate flash memory cell thereby reducing an over etch time associated with an etching process to form the composite spacer.

In an advantageous embodiment, the composite spacer forms a composite contact spacer proximate a composite floating gate spacer of the split gate flash memory cell. In related aspects, the present invention provides a method of forming the composite spacer, and a split gate flash memory cell employing the same. Inasmuch as a layer of the composite spacer incorporates a varying deposition distribution across a surface thereof, an over etch time may be reduced in forming the composite spacer.

In yet another aspect, the present invention provides a coupling spacer for use with a split gate flash memory cell on a substrate having a substrate insulating layer thereon. In one embodiment, the coupling spacer includes a conductive layer that extends between a floating gate and the substrate insulating layer adjacent a source recessed into the substrate of the split gate flash memory cell thereby increasing a coupling area between the floating gate and the source. In related aspects, the present invention provides a method of forming the composite spacer, and a split gate flash memory cell employing the same. Inasmuch as the coupling spacer increases a coupling area between the source and floating gate, a coupling efficiency within the split gate flash memory cell is enhanced.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the advantageous embodiments of a split gate flash memory cell are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to advantageous embodiments in a specific context, namely, a spacer for a split gate flash memory cell, a split gate flash memory cell, and related method of forming the spacer and the split gate flash memory cell. The principles of the present invention, however, may also be applied to other semiconductor devices of like construction. The advantages associated with the split gate flash memory cell as disclosed herein further exploit the benefits associated with the application thereof.

Referring now to FIGS. 10 to 18, illustrated are cross sectional views of an embodiment of constructing a split gate flash memory cell according to the principles of the present invention. At an interim step and with reference to FIGS. 10 and 11, an active region has been formed by a conventional local oxidation of silicon process or a shallow trench isolation process on a semiconductor substrate 200 (e.g., a p-type silicon substrate). In accordance with a shallow trench isolation process and within the active region, a substrate insulating layer 210 having a thickness of about 85 angstroms has been formed on and overlies the substrate 200 by an oxidation process. Additionally, a first conductive layer 215 of doped polycrystalline silicon having a thickness of about 700 angstroms has been formed on the substrate insulating layer 210 by a chemical vapor deposition process. The first conductive layer 215 is typically doped by phosphorus ions or arsenic ions by diffusion, implantation or in-situ doping. Thereafter, a buffer layer 220 of nitride having a thickness of about 4000 angstroms is formed on the first conductive layer 215 by a low pressure chemical vapor deposition process. A photolithography and etching process is then performed on the buffer layer 220 and a portion of the buffer layer 220 is removed to form an opening therein (see FIG. 11).

Figure 1:
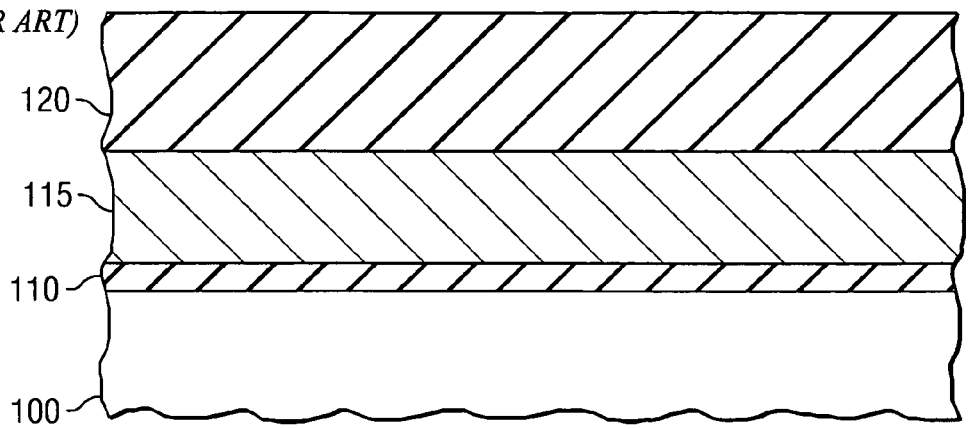
FIGS. 1 to 9 illustrate cross sectional views of a conventional process of constructing a split gate flash memory cell.
Figure 2:
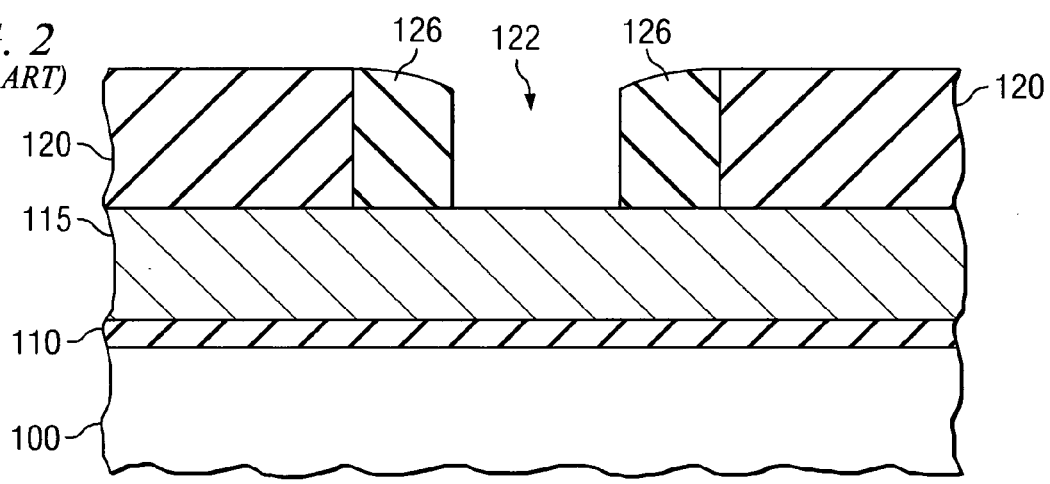
Figure 3:
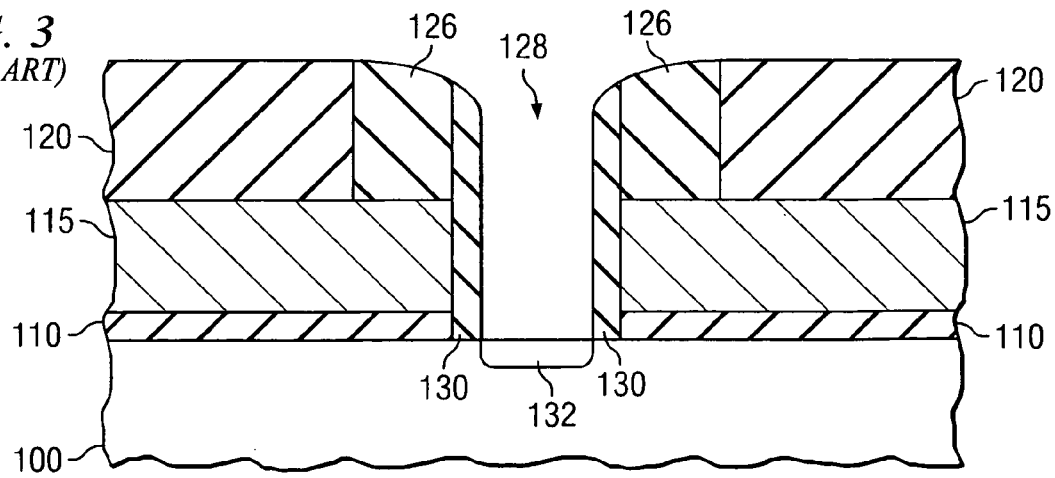
Figure 4:
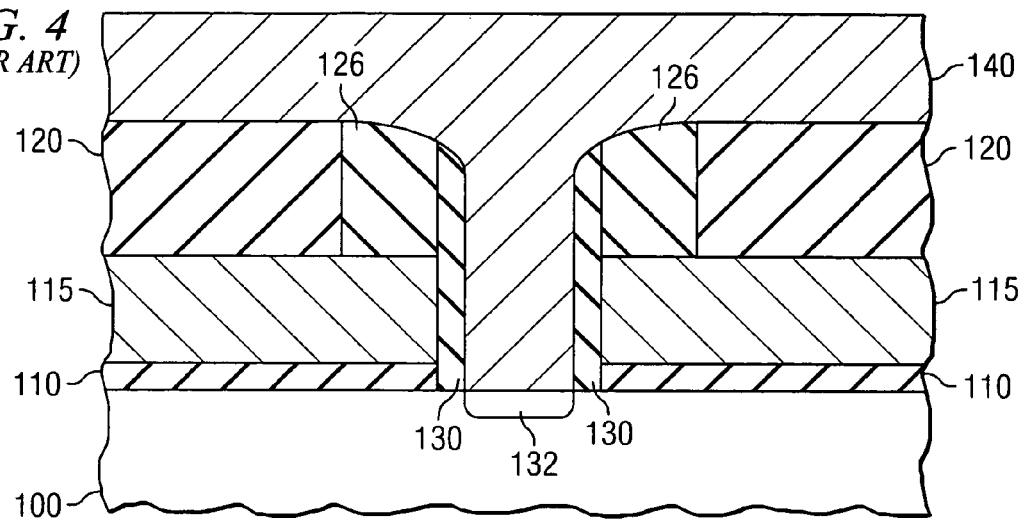
Figure 5:
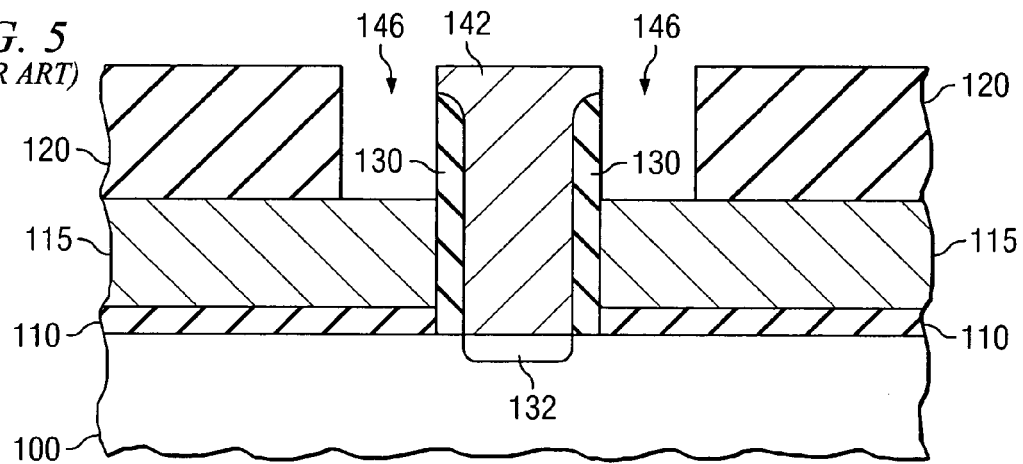
Figure 6:
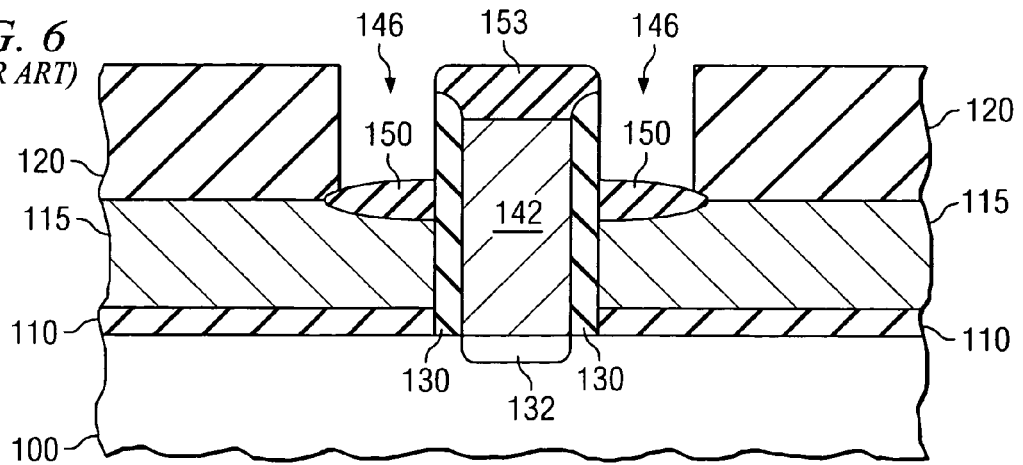
Figure 7:
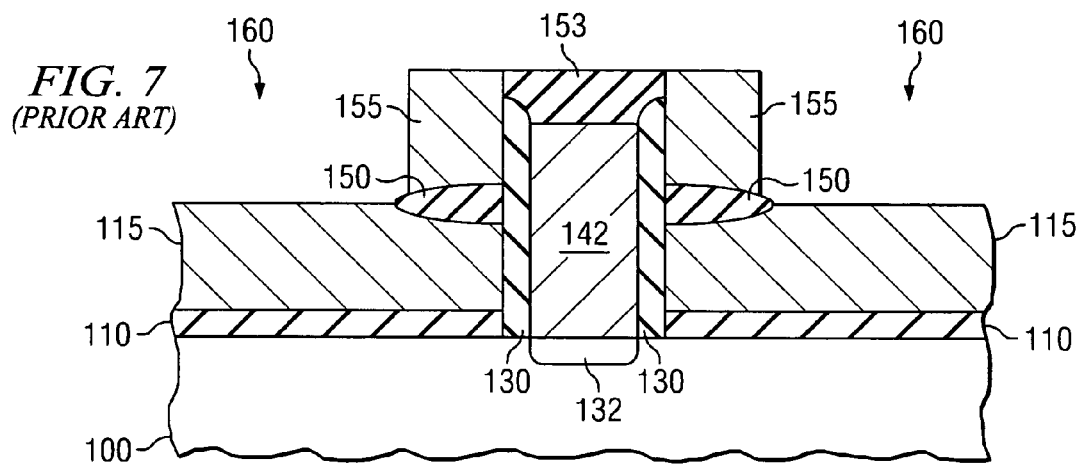
Figure 8:
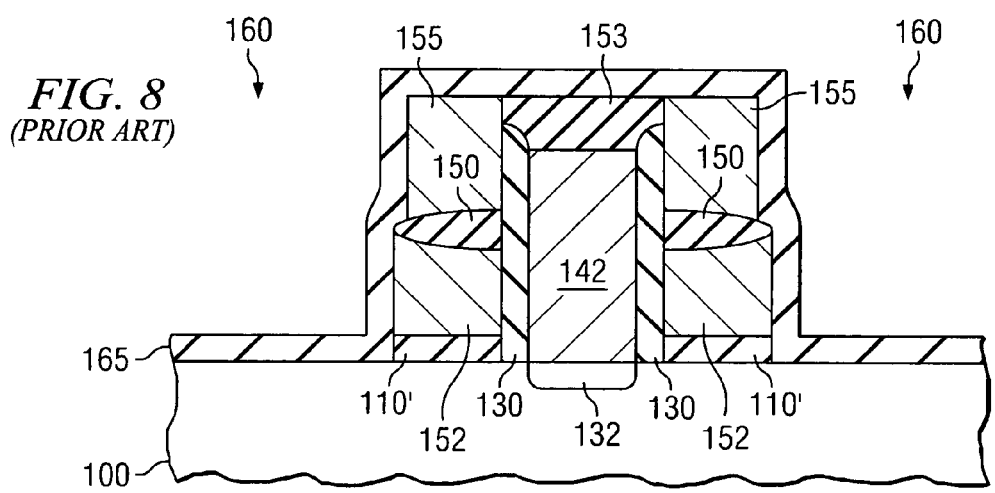
Figure 9:
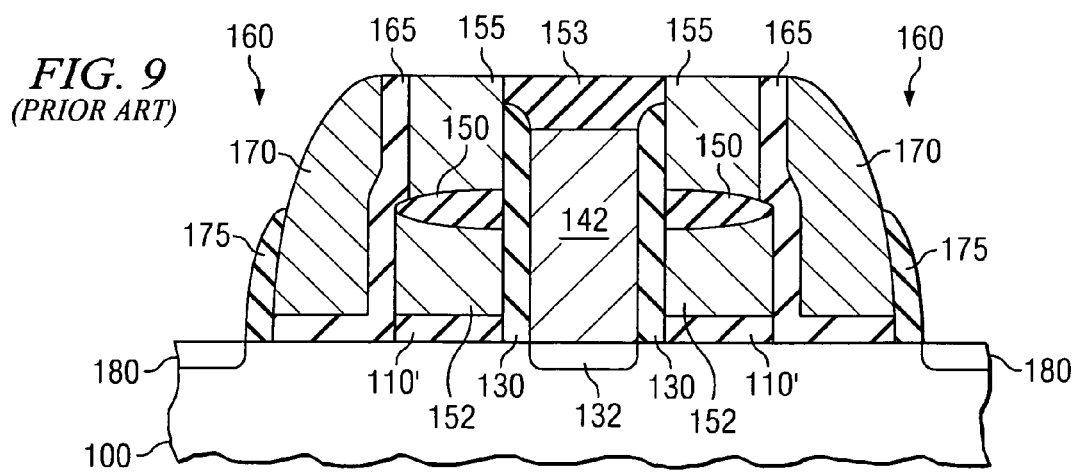
Figure 10:
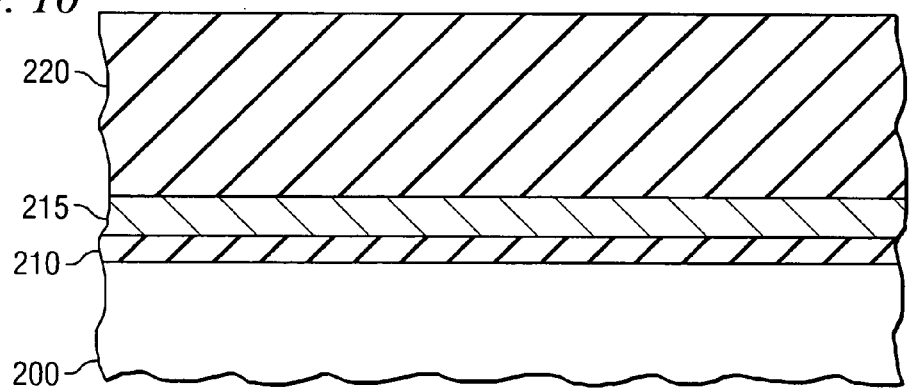
FIGS. 10 to 18 illustrate cross sectional views of an embodiment of constructing a split gate flash memory cell according to the principles of the present invention.
Figure 11:
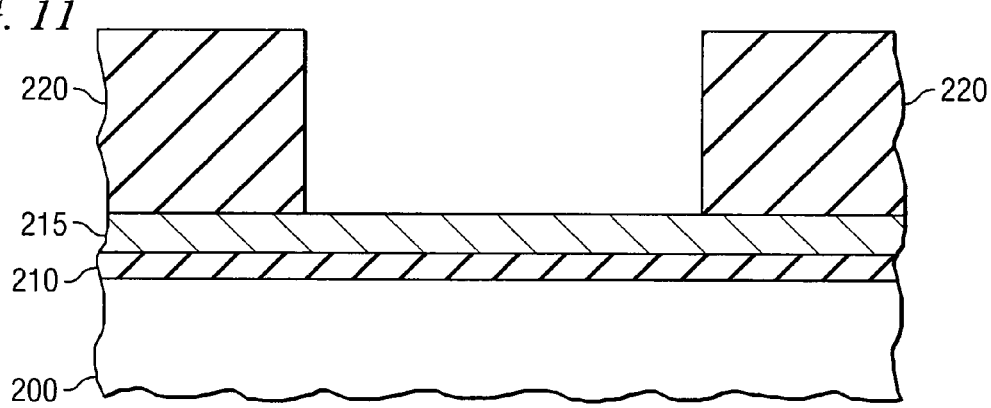
Figure 12:
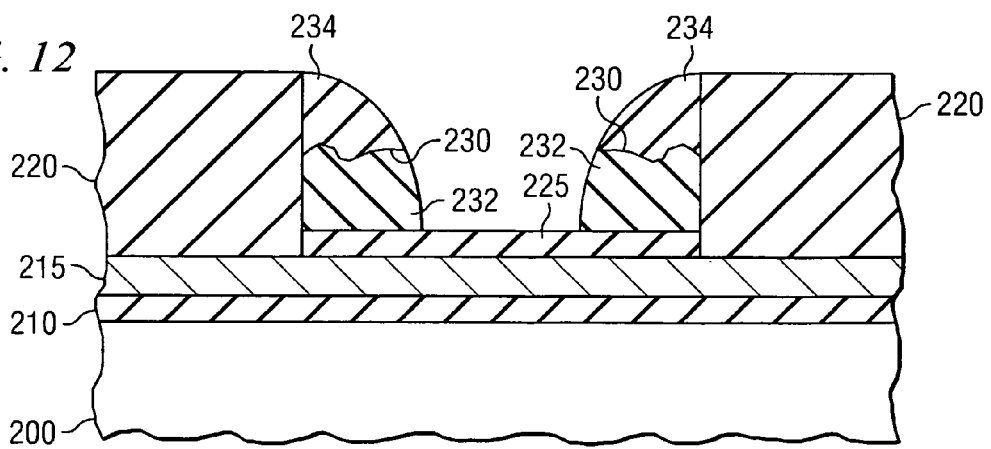

Turning now to FIG. 12, a thermal oxidation process is performed to form an insulating layer (not shown) of oxide having a thickness of about 150 angstroms on exposed portions of the first conductive layer 215 and the buffer layer 220. The thermal oxidation process may be performed by thermal oxidation in dry oxygen carried out in an oxidation furnace in a temperature range between about 750 to 950 degrees Celsius. Alternatively, other oxidation methods can be used such as oxidation in a dry oxygen and anhydrous hydrogen chloride in an atmospheric or low pressure environment, or low temperature, high-pressure, and the like.

Thereafter, a low pressure tetraethyl orthosilicate (LP-TEOS) layer (not shown) having a thickness of about 2000 angstroms is deposited over the above referenced insulating layer. Additionally, a plasma enhanced tetraethyl orthosilicate (PETEOS) layer (not shown) having a thickness of about 1400 angstroms is deposited over the above referenced LPTEOS layer. Then, an anisotropic etching process is performed and the insulating layer remaining over the first conductive layer 215 forms a floating gate insulating layer 225. In accordance with the etching process, the remaining portion of the LPTEOS layer (referred to as a first spacer insulating layer 232) and the PETEOS layer (referred to as a second spacer insulating layer 234) form composite floating gate spacers (also referred to as composite spacers) 230 on opposing walls of the opening in the buffer layer 220 and overlying the floating gate insulating layer 225.

As mentioned above, critical dimensions of a split gate flash memory cell may be affected by variations in material deposition processes and etch rates depending on a location of a particular memory cell on the substrate 200. The composite floating gate spacers 230, therefore, are composed of multiple layers having different deposition distributions depending on a location of the split gate flash memory cell on the substrate 200. In the present embodiment, the PETEOS layer tends to form a thicker composition proximate a center of the substrate 200 and a thinner composition toward an edge of the substrate 200 during a deposition process. Conversely, the LPTEOS layer tends to form a thinner composition proximate the center of the substrate 200 and a thicker composition toward the edge of the substrate 200 during a deposition process. The variation in material thickness across the substrate 200 can be on the order of tens of angstroms which may be detrimental to a uniformity of critical dimensions (or a lack thereof) of features of the split gate flash memory cell.

As a result, the composite floating gate spacers 230 are formed by a combination of the second spacer insulating layer (e.g., a PETEOS layer) 234 overlying the first spacer insulating layer (e.g., a LPTEOS layer) 232 to provide a more uniform composition thereof. Inasmuch as the first and second spacer insulating layers 232, 234 generally demonstrate opposite deposition distributions (also referred to as first and second deposition distributions, respectively), more uniform composite floating gate spacers 230 are constructed for split gate flash memory cells constructed across the substrate 200.

Additionally, the etch rate of materials may vary depending on a location of the split gate flash memory cell on the substrate 200. TABLE I demonstrates the difference in etch rates for a layer of 2000 angstroms of LPTEOS across a substrate 200. To achieve a uniformity of the etched away material within 2.6 percent, different etch rates were observed across the substrate 200 as set forth below.

TABLE I

| Etch Rate (angstroms per minute within 2.6 percent uniformity) | | | |
|---|---|---|---|
| X-direction | Rate | Y-direction | Rate |
| Right Edge | 941 | Top Edge | 940 |
| Right Center | 974 | Top Center | 974 |
| Center | 984 | Center | 984 |
| Left Center | 979 | Bottom Center | 972 |
| Left Edge | 952 | Bottom Edge | 933 |

Thus, if the deposition distributions of the materials are not taken into account, the difference in etch rate may exacerbate a non-uniformity of critical dimensions within the split gate flash memory cell. Employing materials that demonstrate substantially opposite deposition distributions (e.g., the LPTEOS and PETEOS layers) for the composite floating gate spacers 230 compensate for the variations in the etch rate across the substrate 200 to obtain more uniform critical dimensions for the composite floating gate spacers 230 across the substrate 200. As an example, the variation in the critical dimensions for the composite floating gate spacers 230 according to the design as described above demonstrated an improvement from about a 0.024 micrometer variation to about a 0.07 micrometer variation.

Figure 13:
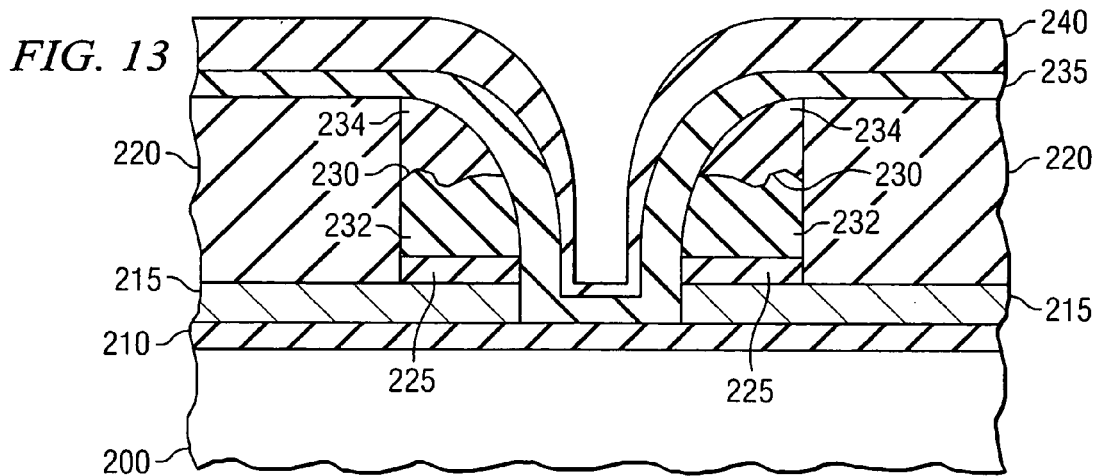

Turning now to FIG. 13, using the buffer layer 220 and the composite floating gate spacers 230 as a mask, the floating gate insulating layer 225, the first conductive layer 215 interposed between the composite floating gate spacers 230 is removed by an anisotropic etching process. Thereafter, a first contact spacer insulating layer (also referred to as a first spacer insulating layer) 235 formed by a hot temperature oxide layer having a thickness of about 500 angstroms is deposited over the buffer layer 220, and over and between the composite floating gate spacers 230. Also, a second contact spacer insulating layer (also referred to as a second spacer insulating layer) 240 formed by a resist protect oxide layer having a thickness in selected areas of about 800 angstroms is deposited over and overlies the first contact spacer insulating layer 235. The first contact spacer insulating layer 235 has a substantially uniform deposition distribution across a surface thereof. For reasons that will become more apparent, the second contact spacer insulating layer 240 has a varying deposition distribution across a surface thereof, namely, a thickness of about 800 angstroms above the buffer layer 220 but a thinner composition between the composite floating gate spacers 230.

Figure 14:
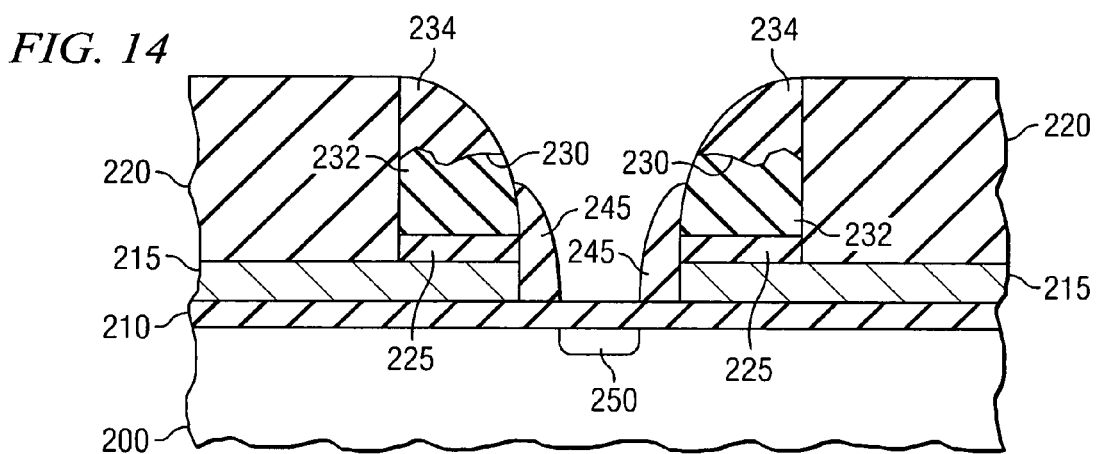

Turning now to FIG. 14, an anisotropic etching process is performed to substantially remove the first and second contact spacer insulating layers 235, 240. The portion of the first and second contact spacer insulating layers 235, 240 remaining between the composite floating gate spacers 230 form composite contact spacers (also referred to as composite spacers) 245. Impurity ions (e.g., n-type impurity ions) are then implanted between the composite contact spacers 245 into the substrate 200 to form a source 250 recessed therein.

As mentioned above, over etching is often employed to ensure that unwanted materials are removed during the etching process. In accordance with the etching process as described with respect the preceding FIGUREs, over etching is employed to ensure that a substantial portion of the first and second contact spacer insulating layers 235, 240 are removed to form the composite contact spacers 245. To the contrary, however, it may be detrimental to the split gate flash memory cell if an over etching time is extended thereby providing for an opportunity that the buffer layer 220, composite floating gate spacers 230, the underlying substrate insulating layer 210 and substrate 200 are deteriorated beyond acceptable tolerances during the etching process. A construction of the composite contact spacers 245 reduces an over etching time associated with the manufacture thereof in an attempt to protect surrounding and underlying materials from the deleterious affects from over etching.

More specifically, the composite contact spacers 245 employ at least one insulating layer (in this case, the second contact spacer insulating layer 240) having a varying deposition distribution across a surface thereof. Thus, in a narrow region adjacent to and between the composite floating gate spacers 230, the second contact spacer insulating layer 240 has a thinner composition as opposed to above the buffer layer 220. This is especially advantageous because it is more difficult to remove the unwanted portions of the second contact spacer insulating layer 240 between the composite floating gate spacers 230 than above the buffer layer 220. As a result, an over etching time is reduced in accordance with the principles of the present invention. If the second contact spacer insulating layer 240 had a uniform deposition distribution across a surface thereof, it is very likely that unacceptable portions of the buffer layer 220, the composite floating gate spacers 230 and, possibly, the substrate insulating layer 210 and the substrate 200, may have been etched away during the etching process to form the composite contact spacers 245. For instance, a six percent reduction in etched away material of the buffer layer 220 has been observed when constructing composite contact spacers 245 according to the principles of the present invention and employing etching times according to present etching process practices.

Figure 15:
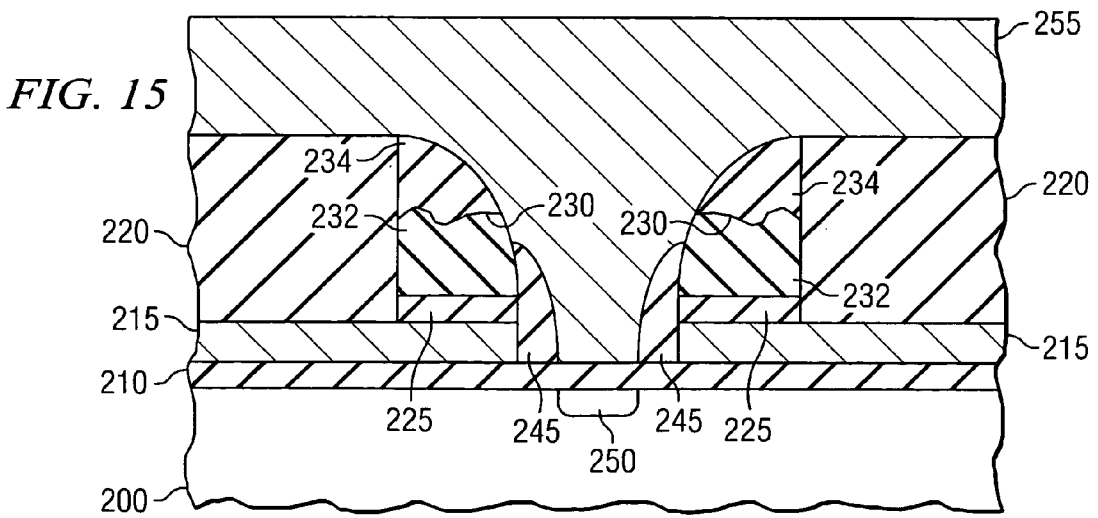
Figure 16:
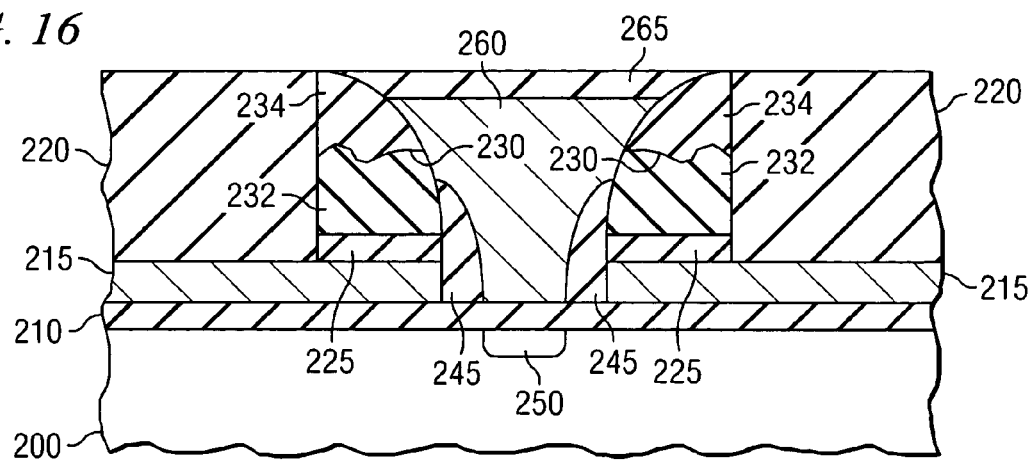

Turning now to FIGS. 15 and 16, a second conductive layer 255 of doped polycrystalline silicon having a thickness of about 2200 angstroms is formed by a low pressure chemical vapor deposition process on the buffer layer 220, and over and between the composite floating gate spacers 230 and composite contact spacers 245. The second conductive layer 255 is typically doped by the phosphorus ions or arsenic ions by diffusion, implantation or in-situ doping. Thereafter and with reference to FIG. 16, a common source line 260 is formed by performing an anisotropic etching process on the second conductive layer 255. Thus, the common source line 260 is located adjacent the composite floating gate spacers 230 and composite contact spacers 245 and overlying the source 250. A thermal oxidation process (analogous to the process described above) is then performed to form an insulating layer (not shown) of oxide having a thickness of about 150 angstroms over the buffer layer 220 and common source line 260. The insulating layer is patterned by an etching process to form a common source line insulating layer 265.

Figure 17:
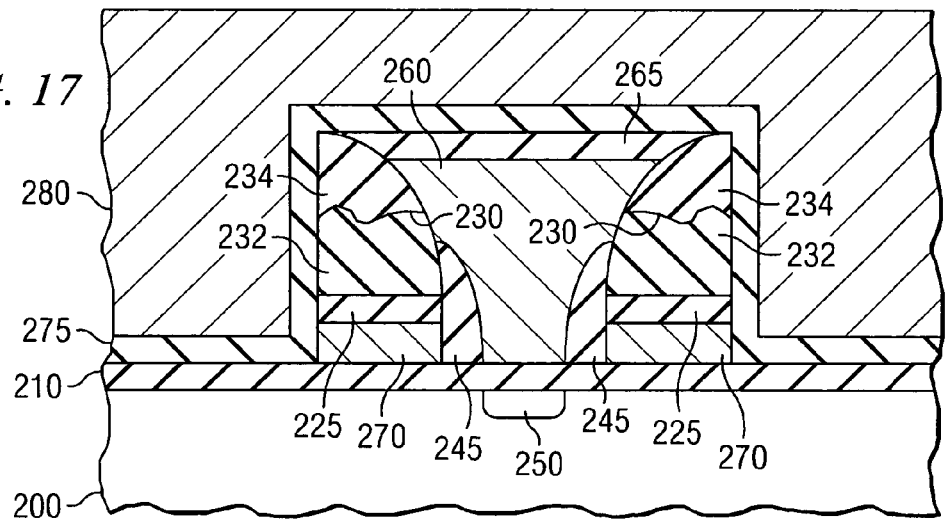

Turning now to FIG. 17, the buffer layer 220 is stripped away employing an aqueous phosphoric acid etchant at an elevated temperature. Then, the first conductive layer 215 is patterned by an etching process to form floating gates 270, overlying the substrate insulating layer 210 and underlying the floating gate insulating layer 225. A thermal oxidation process (analogous to the process described above) is then performed to form a tunneling insulating layer 275 of oxide having a thickness of about 145 angstroms over the substrate insulating layer 210, exposed portions of the composite floating gate spacers 230 and the common source line insulating layer 265. Thereafter, a third conductive layer 280 of doped polycrystalline silicon having a thickness of about 1800 angstroms is formed by a low pressure chemical vapor deposition process over the tunneling insulating layer 275. The third conductive layer 280 is typically doped by the phosphorus ions or arsenic ions by diffusion, implantation or in-situ doping.

Figure 18:
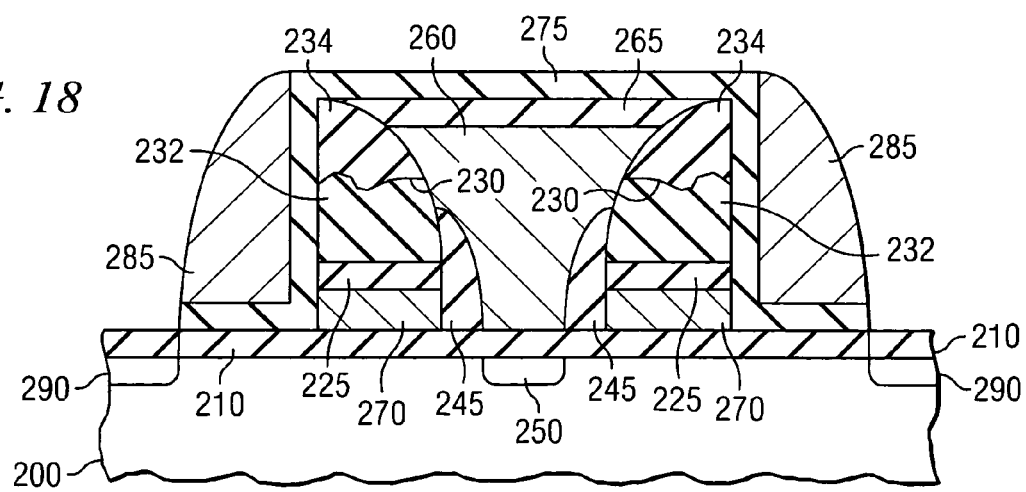
Figure 19:
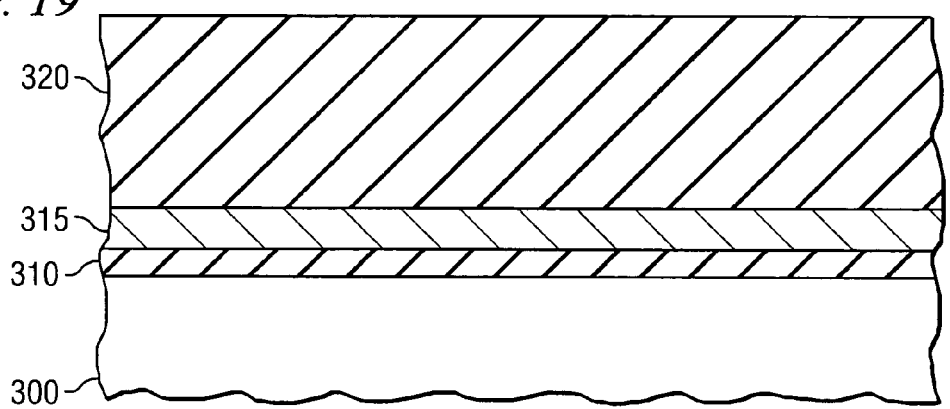
FIGS. 19 to 29 illustrate cross sectional views of another embodiment of constructing a split gate flash memory cell according to the principles of the present invention.
Figure 20:
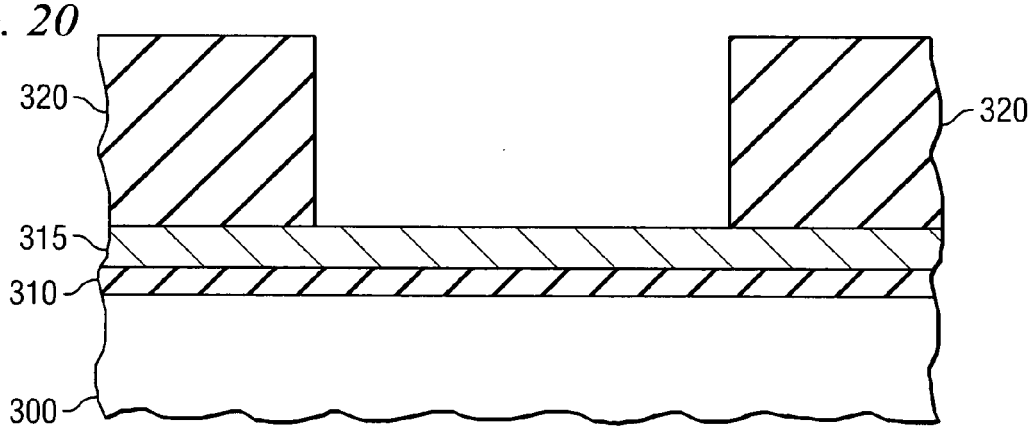

Turning now to FIG. 18, control gates 285 are formed by performing an anisotropic etching process on the third conductive layer 280. Additionally, portions of the tunneling insulating layer 275 not covered by the control gates 285 are removed by an etching process. Thus, the tunneling insulating layer 275 is located adjacent the composite floating gate spacers 230 and floating gates 270, but on an opposing side from the common source line 260. The control gates 285 are located adjacent the tunneling insulating layer 275. Finally, impurity ions (e.g., n-type impurity ions) are implanted into the substrate 200 about the control gates 285 to form drains 290 recessed therein of the split gate flash memory cell.

Referring now to FIGS. 19 to 29, illustrated are cross sectional views of another embodiment of constructing a split gate flash memory cell according to the principles of the present invention. At an interim step and with reference to FIGS. 19 and 20, an active region has been formed by a conventional local oxidation of silicon process or a shallow trench isolation process on a semiconductor substrate 300 (e.g., a p-type silicon substrate). In accordance with a shallow trench isolation process and within the active region, a substrate insulating layer 310 having a thickness of about 85 angstroms has been formed on and overlies the substrate 300 by an oxidation process. Additionally, a first conductive layer 315 of doped polycrystalline silicon having a thickness of about 700 angstroms has been formed on the substrate insulating layer 310 by a chemical vapor deposition process. The first conductive layer 315 is typically doped by phosphorus ions or arsenic ions by diffusion, implantation or in-situ doping. Thereafter, a buffer layer 320 of nitride having a thickness of about 4000 angstroms is formed on the first conductive layer 315 by a low pressure chemical vapor deposition process. A photolithography and etching process is then performed on the buffer layer 320 and a portion of the buffer layer 320 is removed to form an opening therein (see FIG. 20).

Figure 21:
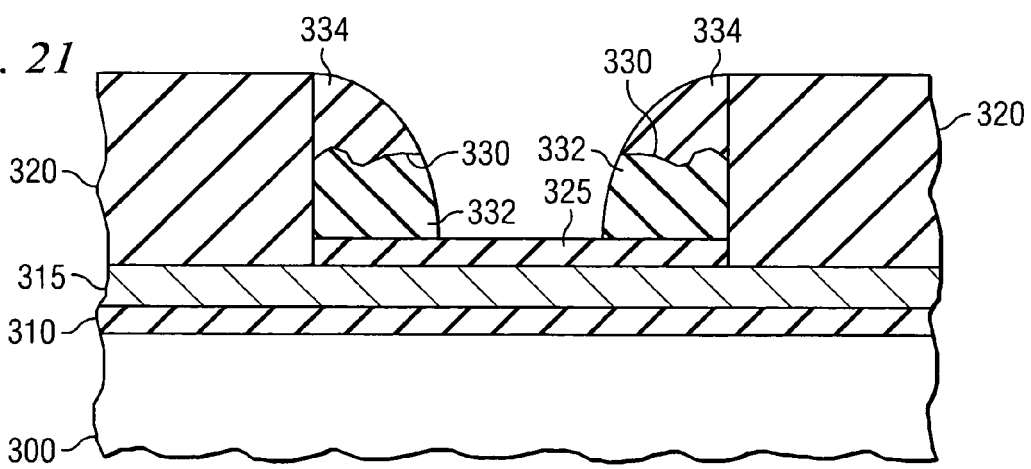

Turning now to FIG. 21, a thermal oxidation process is performed to form an insulating layer (not shown) of oxide having a thickness of about 150 angstroms on exposed portions of the first conductive layer 315 and the buffer layer 320. The thermal oxidation process may be performed by thermal oxidation in dry oxygen carried out in an oxidation furnace in a temperature range between about 750 to 950 degrees Celsius. Alternatively, other oxidation methods can be used such as oxidation in a dry oxygen and anhydrous hydrogen chloride in an atmospheric or low pressure environment, or low temperature, high-pressure, and the like.

Thereafter, a low pressure tetraethyl orthosilicate (LPTEOS) layer (not shown) having a thickness of about 2000 angstroms is deposited over the above referenced insulating layer. Additionally, a plasma enhanced tetraethyl orthosilicate (PETEOS) layer (not shown) having a thickness of about 1400 angstroms is deposited over the above referenced LPTEOS layer. Then, an anisotropic etching process is performed and the insulating layer remaining over the first conductive layer 315 forms a floating gate insulating layer 325. In accordance with the etching process, the remaining portion of the LPTEOS layer (referred to as a first spacer insulating layer 332) and the PETEOS layer (referred to as a second spacer insulating layer 334) form composite floating gate spacers (also referred to as composite spacers) 330 on opposing walls of the opening in the buffer layer 320 and overlying the floating gate insulating layer 325. For the reasons as stated above, the composite floating gate spacers 330 exhibit a more uniform composition and, ultimately, more uniform critical dimensions across the substrate 200.

Figure 22:
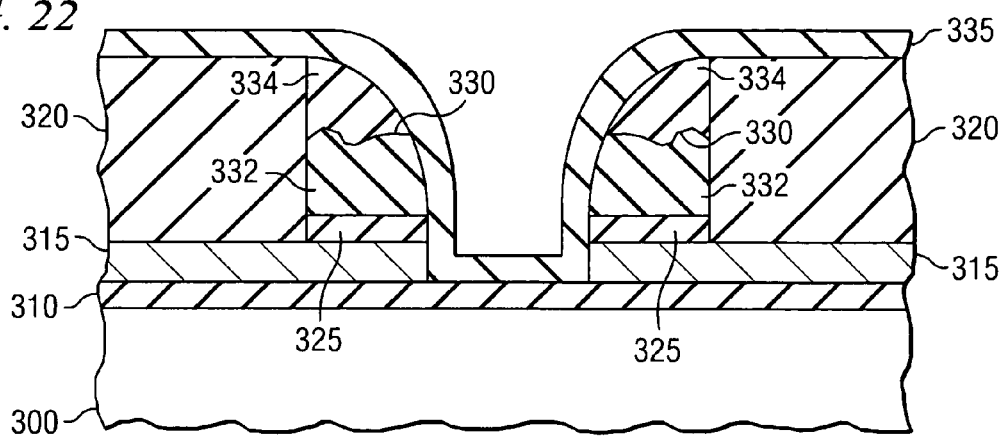
Figure 23:
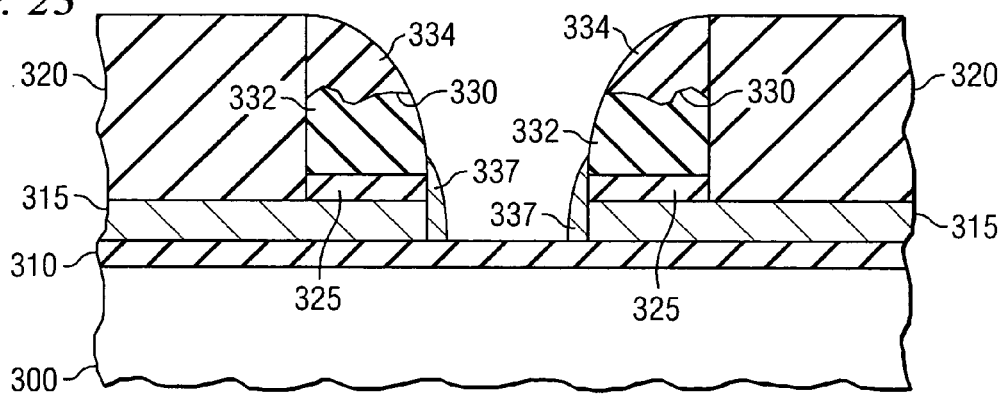

Turning now to FIGS. 22 and 23, using the buffer layer 320 and the composite floating gate spacers 330 as a mask, the floating gate insulating layer 325, the first conductive layer 315 interposed between the composite floating gate spacers 330 is removed by an anisotropic etching process. Then, a second conductive layer 335 of doped polycrystalline silicon having a thickness of about 200 angstroms is formed by a low pressure chemical vapor deposition process on the buffer layer 320, and over and between the composite floating gate spacers 330. The second conductive layer 335 is typically doped by the phosphorus ions or arsenic ions by diffusion, implantation or in-situ doping. Thereafter and with reference to FIG. 23, coupling spacers 337 are formed by performing an anisotropic etching process on the second conductive layer 335.

Figure 24:
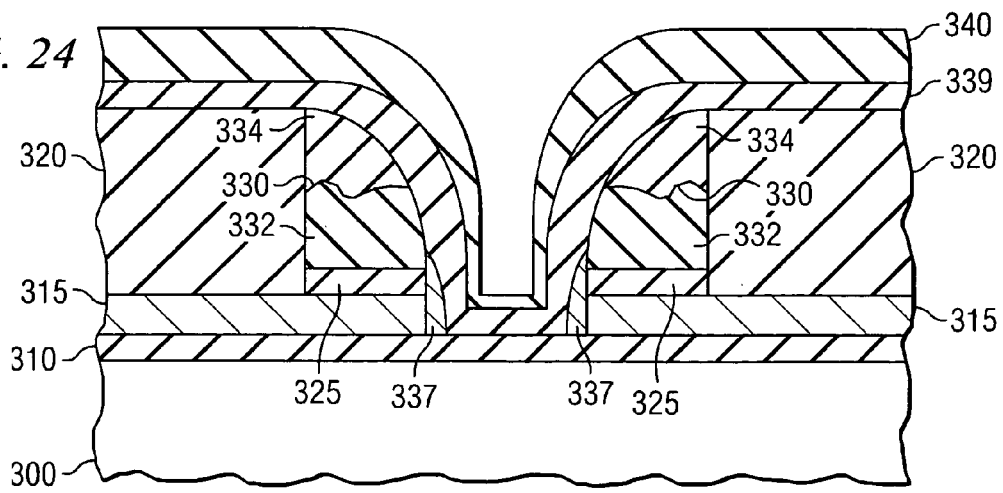

Turning now to FIG. 24, a first contact spacer insulating layer (also referred to as a first spacer insulating layer) 339 formed by a hot temperature oxide layer having a thickness of about 500 angstroms is deposited over the buffer layer 320, and over and between the composite floating gate spacers 330 and the coupling spacers 337. Also, a second contact spacer insulating layer (also referred to as a second spacer insulating layer) 340 formed by a resist protect oxide layer having a thickness in selected areas of about 800 angstroms is deposited over and overlies the first contact spacer insulating layer 339. The first contact spacer insulating layer 339 has a substantially uniform deposition distribution across a surface thereof. The second contact spacer insulating layer 340 has a varying deposition distribution across a surface thereof, namely, a thickness of about 800 angstroms above the buffer layer 320 but a thinner composition between the composite floating gate spacers 330.

Figure 25:
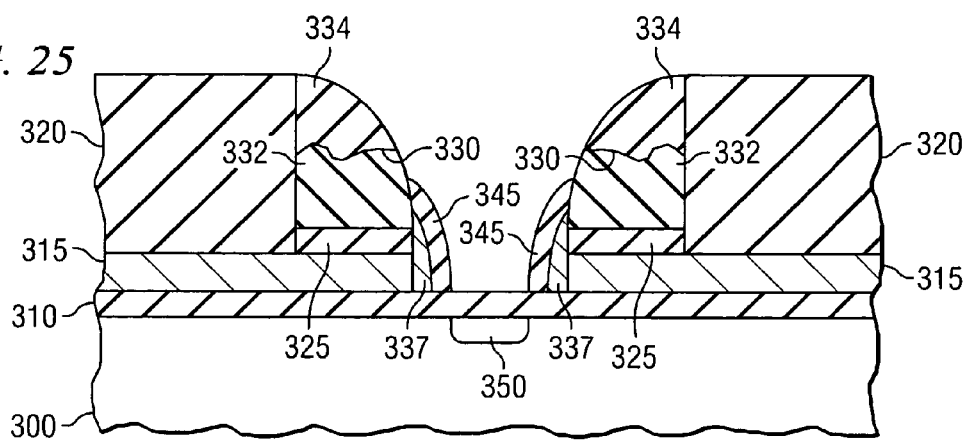

Turning now to FIG. 25, an anisotropic etching process is performed to substantially remove the first and second contact spacer insulating layers 339, 340. The portion of the first and second contact spacer insulating layers 339, 340 remaining between the composite floating gate spacers 330 and overlying the coupling spacers 337 form composite contact spacers (also referred to as composite spacers) 345. Impurity ions (e.g., n-type impurity ions) are then implanted between the composite contact spacers 345 into the substrate 300 to form a source 350 recessed therein. For the reasons as stated above, a construction of the composite contact spacers 345 reduces an over etching time associated with the manufacture thereof in an attempt to protect surrounding and underlying materials from the deleterious affects from over etching.

Figure 26:
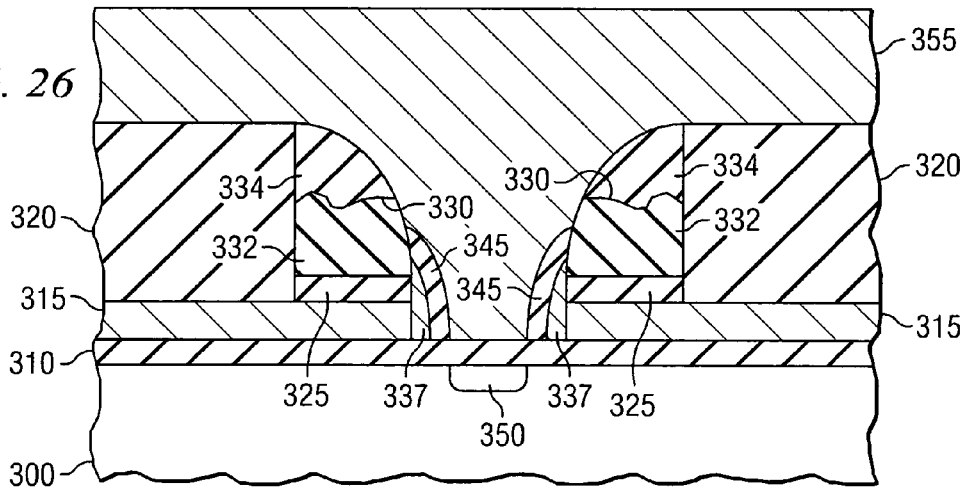
Figure 27:
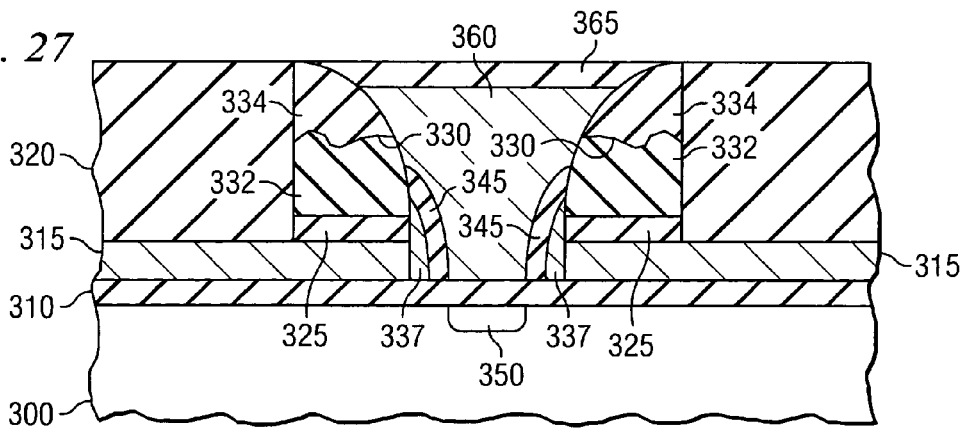

Turning now to FIGS. 26 and 27, a third conductive layer 355 of doped polycrystalline silicon having a thickness of about 2200 angstroms is formed by a low pressure chemical vapor deposition process on the buffer layer 320, and over and between the composite floating gate spacers 330 and composite contact spacers 345. The third conductive layer 355 is typically doped by the phosphorus ions or arsenic ions by diffusion, implantation or in-situ doping. Thereafter and with reference to FIG. 27, a common source line 360 is formed by performing an anisotropic etching process on the third conductive layer 355. Thus, the common source line 360 is located adjacent the composite floating gate spacers 330 and composite contact spacers 345 and overlying the source 350. A thermal oxidation process (analogous to the process described above) is then performed to form an insulating layer (not shown) of oxide having a thickness of about 150 angstroms over the buffer layer 320 and common source line 360. The insulating layer is patterned by an etching process to form a common source line insulating layer 365.

Figure 28:
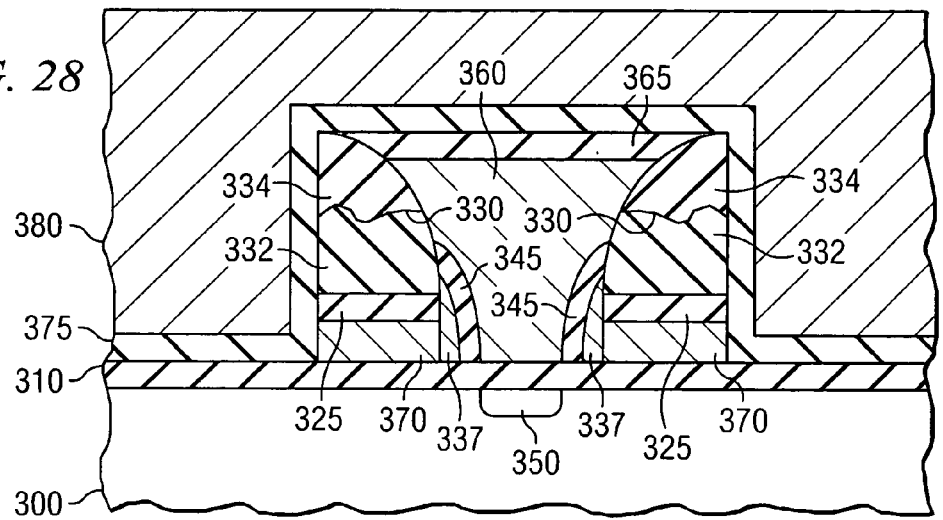

Turning now to FIG. 28, the buffer layer 320 is stripped away employing an aqueous phosphoric acid etchant at an elevated temperature. Then, the first conductive layer 315 is patterned by an etching process to form floating gates 370, overlying the substrate insulating layer 310 and underlying the floating gate insulating layer 325. With respect to the coupling spacers 337 and floating gates 370, and in keeping with the general discussion of coupling efficiency as described above, a low coupling efficiency between sections of the split gate flash memory cell can deter from a performance of the memory cell. Consequently, the split gate flash memory cell includes the coupling spacers 337 which extend between respective floating gates 370 and the substrate insulating layer 310 adjacent the source 350, proximate the composite floating gate spacers 330, and underlying the composite contact spacers 345 of the split gate flash memory cell.

The coupling spacers 337, therefore, provide a larger coupling area and between the floating gates 370 and the source 350 and, ultimately, the common source line 360 of the split gate flash memory cell. As a result, the coupling spacers 337 increase a capacitance between the floating gates 370 and common source line 360 and the split gate flash memory cell benefits from an increase in the coupling efficiency. The increase in coupling efficiency for the split gate flash memory cell as provided by the coupling spacers 337 enhances, for instance, a programming speed of the memory cell (e.g., the writing speeds of the memory cell). A high programming speed is a fundamental characteristic and prerequisite in NOR-type split gate flash memory cells.

Returning to the FIG. 28, a thermal oxidation process (analogous to the process described above) is then performed to form a tunneling insulating layer 375 of oxide having a thickness of about 145 angstroms over the substrate insulating layer 310, exposed portions of the composite floating gate spacers 330 and the common source line insulating layer 365. Thereafter, a fourth conductive layer 380 of doped polycrystalline silicon having a thickness of about 1800 angstroms is formed by a low pressure chemical vapor deposition process over the tunneling insulating layer 375. The fourth conductive layer 380 is typically doped by the phosphorus ions or arsenic ions by diffusion, implantation or in-situ doping.

Figure 29:
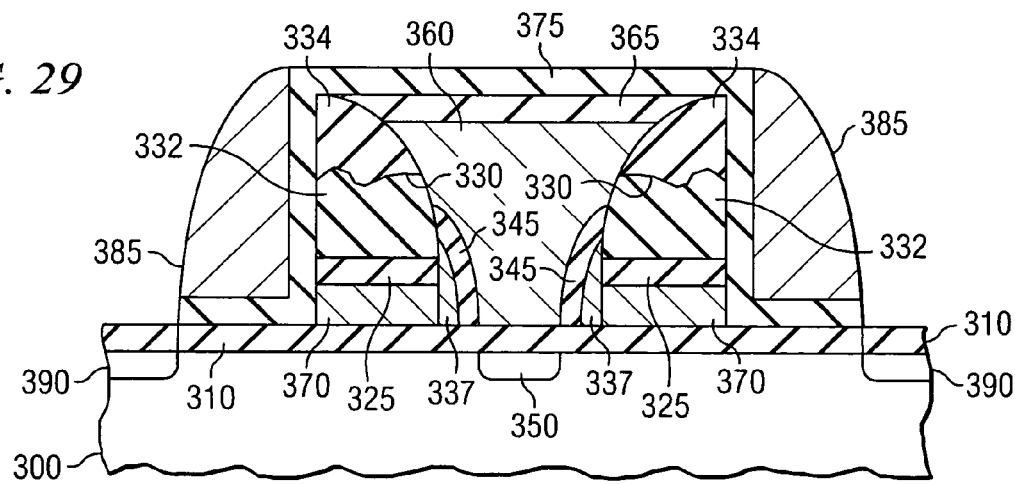

Turning now to FIG. 29, control gates 385 are formed by performing an anisotropic etching process on the fourth conductive layer 380. Additionally, portions of the tunneling insulating layer 375 not covered by the control gates 385 are removed by an etching process. Thus, the tunneling insulating layer 375 is located adjacent the composite floating gate spacers 330 and floating gates 370, but on an opposing side from the common source line 360. The control gates 385 are located adjacent the tunneling insulating layer 375. Finally, impurity ions (e.g., n-type impurity ions) are implanted into the substrate 300 about the control gates 385 to form drains 390 recessed therein of the split gate flash memory cell.

Thus, a spacer for a split gate flash memory cell, a split gate flash memory cell, and related method of forming the spacer and the split gate flash memory cell with readily attainable and quantifiable advantages has been introduced. Those skilled in the art should understand that the previously described embodiments of the split gate flash memory cell and related method of forming the same are submitted for illustrative purposes only and that other embodiments capable of overcoming non-uniform critical dimensions of the memory cells constructed across a substrate, over etching times within selecting regions of the memory cell, or low coupling efficiency between selected sections of the memory cell are well within the broad scope of the present invention.

Also, although the present invention and its advantages have been described in detail, it should be understood that various changes, substitutions and alterations can be made herein without departing from the spirit and scope of the invention as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a composite spacer for use wit a split gate flash memory cell on a substrate, comprising:
   providing a first spacer insulating layer having a substantially uniform deposition distribution across a surface thereof; and
   providing a second spacer insulating layer over said first spacer insulating layer, said second spacer insulating layer having a varying deposition distribution across a surface thereof, said second spacer insulating layer having a thinner composition in selected regions of said split gate flash memory cell thereby reducing an over etch time associated with an etching process to form said composite spacer.

2. The method as recited in claim 1 wherein said composite spacer forms a composite contact spacer proximate a composite floating gate spacer of said split gate flash memory cell.

3. The method as recited in claim 1 wherein said selected region is a narrow region between composite floating gate spacers of said split gate flash memory cell, said second spacer insulating layer having a thinner composition therebetween.

4. The method as recited in claim 1 wherein said first spacer insulating layer is formed by a hot temperature oxide layer.

5. The method as recited in claim 1 wherein said second spacer insulating layer is formed by a resist protect oxide layer.

6. A composite spacer for use with a split gate flash memory cell on a substrate, comprising:
   a first spacer insulating layer having a substantially uniform deposition distribution across a surface thereof; and
   a second spacer insulating layer, located over said first spacer insulating layer, having a varying deposition distribution across a surface thereof, said second spacer insulating layer having a thinner composition in selected regions of said split gate flash memory cell thereby reducing an over etch time associated with an etching process to form said composite spacer.

7. The composite spacer as recited in claim 6 wherein said composite spacer forms a composite contact spacer proximate a composite floating gate spacer of said split gate flash memory cell.

8. The composite spacer as recited in claim 6 wherein said selected region is a narrow region between composite floating gate spacers of said split gate flash memory cell, said second spacer insulating layer having a thinner composition therebetween.

9. The composite spacer as recited in claim 6 wherein said first spacer insulating layer is formed by a hot temperature oxide layer.

10. The composite spacer as recited in claim 6 wherein said second spacer insulating layer is formed by a resist protect oxide layer.

11. A method of forming a composite spacer for use with a split gate flash memory cell on a substrate, comprising:
    providing a first spacer insulating layer having a first deposition distribution that varies as a function of a location of said split gate flash memory cell on said substrate; and
    providing a second spacer insulating layer over said first spacer insulating layers and having a second deposition distribution that varies in substantial opposition to said first deposition distribution of said first spacer insulating layer as a function of said location of said split gate flash memory cell on said substrate.

12. The method as recited in claim 11 wherein said composite spacer forms a composite floating gate spacer proximate a floating gate of said split gate flash memory cell.

13. The method as recited in claim 11 wherein said first spacer insulating layer forms a thicker composition proximate a center of said substrate and a thinner composition toward an edge of said substrate and said second spacer insulating layer forms a thinner composition proximate said center of said substrate and a thicker composition toward said edge of said substrate.

14. The method as recited in claim 11 wherein said spilt gate flash memory cell is located proximate a center of said substrate, said first spacer insulating layer having a thicker composition and said second spacer insulating layer having a thinner composition.

15. The method as recited in claim 11 wherein said first spacer insulating layer is formed by a low pressure tetraethyl orthosilicate layer and said second spacer insulating layer is formed by a plasma enhanced tetraethyl orthosilicate layer.

16. The method of claim 11 further comprising:
    forming a substrate insulating layer on said substrate;
    forming a conductive layer that extends between a floating gate and said substrate insulating layer adjacent a source recessed into said substrate of said split gate flash memory cell thereby increasing a coupling area between said floating gate and said source; and
    forming an insulating spacer substantially overlying said conductive layer, wherein an outer edge of said source is substantially aligned with an edge of said insulating spacer.

17. The method as recited in claim 16 wherein said conductive layer is doped polycrystalline silicon.

18. The method as recited in claim 17 wherein said doped polycrystalline silicon has a thickness of about 200 angstroms.

19. The method as recited in claim 16 wherein said coupling spacer is located proximate a composite floating gate spacer of said split gate flash memory cell.

20. The method as recited in claim 16 wherein said coupling spacer underlies a composite contact spacer of said split gate flash memory cell.

21. A composite spacer for use with a split gate flash memory cell on a substrate, comprising:
    a first spacer insulating layer having a first deposition distribution that varies as a function of a location of said split gate flash memory cell on said substrate; and
    a second spacer insulating layer, located over said first spacer insulating layer, having a second deposition distribution that varies in substantial opposition to said first deposition distribution of said first spacer insulating layer as a function of said location of said spilt gate flash memory cell on said substrate.

22. The composite spacer as recited in claim 21 wherein said composite spacer forms a composite floating gate spacer proximate a floating gate of said split gate flash memory cell.

23. The composite spacer as recited in claim 21 wherein said first spacer insulating layer forms a thicker composition proximate a center of said substrate and a thinner composition toward an edge of said substrate and said second spacer insulating layer forms a thinner composition proximate said center of said substrate and a thicker composition toward said edge of said substrate.

24. The composite spacer as recited in claim 21 wherein said split gate flash memory cell is located proximate a center of said substrate, said first spacer insulating layer having a thicker composition and said second spacer insulating layer having a thinner composition.

25. The composite spacer as recited in claim 21 wherein said first spacer insulating layer is formed by a low pressure tetraethyl orthosilicate layer and said second spacer insulating layer is formed by a plasma enhanced tetraethyl orthosilicate layer.

26. The composite spacer of claim 21 further comprising:
a substrate insulating layer on said substrate;
a conductive layer that extends between a floating gate and said substrate insulating layer adjacent a source recessed into said substrate of said split gate flash memory cell thereby increasing a coupling area between said floating gate and said source; and
an insulating spacer substantially overlying said conductive layer, wherein an outer edge of said source is substantially aligned with an edge of said insulating spacer.

27. The composite spacer as recited in claim 26 wherein said conductive layer is doped polycrystalline silicon.

28. The composite spacer as recited in claim 27 wherein said doped polycrystalline silicon has a thickness of about 200 angstroms.

29. The composite spacer as recited in claim 26 wherein said coupling spacer is located proximate a composite floating gate spacer of said split gate flash memory cell.

30. The composite spacer as recited in claim 26 wherein said coupling spacer underlies a composite contact spacer of said split gate flash memory cell.

31. A method of fanning a split gate flash memory cell, comprising:
providing a substrate;
forming a substrate insulating layer over said substrate;
forming a floating gate over said substrate insulating layer;
forming a floating gate insulating layer over said floating gate; and
forming a composite floating gate spacer, including:
depositing a first spacer insulating layer over said floating gate insulating layer, said first spacer insulating layer having a first deposition distribution that varies as a function of a location of said split gate flash memory cell on said substrate, and
depositing a second spacer insulating layer over said first spacer insulating layer, said second spacer insulating layer having a second deposition distribution that varies in substantial opposition to said first deposition distribution of said first spacer insulating layer as a function of said location of said split gate flash memory cell on said substrate.

32. The method as recited in claim 31, further comprising:
forming a coupling spacer between said floating gate and a source of said split gate flash memory cell; and
forming a composite contact spacer over said coupling spacer.

33. The method as recited in claim 32, further comprising:
forming a common source line adjacent said composite floating gate spacer and composite contact spacer and overlying said source;
forming a tunneling insulating layer adjacent said composite floating gate spacer on an opposing side from said common source line;
forming a control gate adjacent said tunneling insulating layer; and
forming a drain about said control gate and recessed into said substrate.

34. The method as recited in claim 31 wherein said first spacer insulating layer forms a thicker composition proximate a center of said substrate and a thinner composition toward an edge of said substrate and said second spacer insulating layer forms a thinner composition proximate said center of said substrate and a thicker composition toward said edge of said substrate.

35. The method as recited in claim 31 wherein said first spacer insulating layer is formed by a low pressure tetraethyl orthosilicate layer and said second spacer insulating layer is formed by a plasma enhanced tetraethyl orthosilicate layer.

36. A split gate flash memory cell, comprising:
a substrate;
a substrate insulating layer located over said substrate;
a floating gate located over said substrate insulating layer;
a floating gate insulating layer located over said floating gate; and
a composite floating gate spacer, including:
a first spacer insulating layer, located over said floating gate insulating layer, having a first deposition distribution that varies as a function of a location of said split gate flash memory cell on said substrate, and
a second spacer insulating layer, located over said first spacer insulating layer, having a second deposition distribution that varies in substantial opposition to said first deposition distribution of said first spacer insulating layer as a function of said location of said split gate flash memory cell on said substrate.

37. The split gate flash memory cell as recited in claim 36, further comprising:
a coupling spacer that extends between said floating gate and said substrate insulating layer adjacent a source of said spilt gate flash memory cell; and
a composite contact spacer overlying said coupling spacer.

38. The split gate flash memory cell as recited in claim 37, further comprising:
a common source line located adjacent said composite floating gate spacer and composite contact spacer and overlying said source;
a tunneling insulating layer located adjacent said composite floating gate spacer on an opposing side from said common source line;
a control gate located adjacent said tunneling insulating layer; and
a drain about said control gate and recessed into said substrate.

39. The split gate flash memory cell as recited in claim 36 wherein said first spacer insulating layer forms a thicker composition proximate a center of said substrate and a thinner composition toward an edge of said substrate and said second spacer insulating layer forms a thinner composition proximate said center of said substrate and a thicker composition toward said edge of said substrate.

40. The split gate flash memory cell as recited in claim 36 wherein said first spacer insulating layer is formed by a low pressure tetraethyl orthosilicate layer and said second spacer insulating layer is formed by a plasma enhanced tetraethyl orthosilicate layer.

41. A method of forming a split gate flash memory cell, comprising:
providing a substrate;
forming a substrate insulating layer over said substrate;
forming a floating gate over said substrate insulating layer;
forming a floating gate insulating layer over said floating gate; and forming a composite contact spacer proximate said floating gate, including:
providing a first spacer insulating layer having a substantially uniform deposition distribution across a surface thereof, and
depositing a second spacer insulating layer over said first spacer insulating layer, said second spacer insulating layer having a varying deposition distribution across a surface thereof, said second spacer insulating layer having a thinner composition in selected regions of said split gate flash memory cell thereby reducing an over etch time associated with an etching process to form said composite contact spacer.

42. The method as recited in claim 41, further comprising:
forming a coupling spacer between said floating gate and a source of said split gate flash memory cell and underlying said composite contact spacer; and
forming a composite floating gate spacer over said floating gate insulating layer.

43. The method as recited in claim 42, further comprising:
forming a common source line adjacent said composite floating gate spacer and composite contact spacer and overlying said source;
forming a tunneling insulating layer adjacent said composite floating gate spacer on an opposing side from said common source line;
forming a control gate adjacent said tunneling insulating layer and
forming a drain about said control gate and recessed into said substrate.

44. The method as recited in claim 41 wherein said selected region is a narrow region adjacent a composite floating gate spacer of said split gate flash memory cell, said second spacer insulating layer having a thinner composition therebetween.

45. The method as recited in claim 41 wherein said first spacer insulating layer is formed by a hot temperature oxide layer and said second spacer insulating layer is formed by a resist protect oxide layer.

46. A split gate flash memory cell, comprising:
a substrate;
a substrate insulating layer located over said substrate;
a floating gate located over said substrate insulating layer;
a floating gate insulating layer located over said floating gate; and
a composite contact spacer located proximate said floating gate, including:
a first spacer insulating layer having a substantially uniform deposition distribution across a surface thereof, and
a second spacer insulating layer, located over said first spacer insulating layer, having a varying deposition distribution across a surface thereof, said second spacer insulating layer having a thinner composition in selected regions of said split gate flash memory cell thereby reducing an over etch time associated with an etching process to form said composite contact spacer.

47. The split gate flash memory cell as recited in claim 46, further comprising:
a coupling spacer that extends between said floating gate and said substrate insulating layer adjacent a source of said split gate flash memory cell and underlying said composite contact spacer; and
a composite floating gate spacer located over said floating gate insulating layer.

48. The split gate flash memory cell as recited in claim 47, further comprising:
a common source line located adjacent said composite floating gate spacer and composite contact spacer and overlying said source;
a tunneling insulating layer located adjacent said composite floating gate spacer on an opposing side from said common source line;
a control gate located adjacent said tunneling insulating layer; and
a drain about said control gate and recessed into said substrate.

49. The split gate flash memory cell as recited in claim 46 wherein said selected region is a narrow region adjacent a composite floating gate spacer of said split gate flash memory cell, said second spacer insulating layer having a thinner composition therebetween.

50. The split gate flash memory cell as recited in claim 46 wherein said first spacer insulating layer is formed by a hot temperature oxide layer and said second spacer insulating layer is fanned by a resist protect oxide layer.

* * * * *

UNITED STATES PATENT AND TRADEMARK OFFICE
CERTIFICATE OF CORRECTION

PATENT NO. : 7,202,130 B2 Page 1 of 1
APPLICATION NO. : 10/775290
DATED : April 10, 2007
INVENTOR(S) : Liu et al.

It is certified that error appears in the above-identified patent and that said Letters Patent is hereby corrected as shown below:

Title Page, item (56) References Cited;
    insert --6,159,801 12/2000 Hsieh, et al.--
    insert --6,228,695 5/2001 Hsieh, et al.--
    insert --6,232,185 5/2001 Wang--
    insert --6,479,859 11/2002 Hsieh, et al.--
    insert --6,525,371 2/2003 Johnson, et al.--
    insert --6,538,277 3/2003 Sung, et al.--
    insert --6,562,673 5/2003 Lin--
    insert --6,579,761 6/2003 Hsieh--
    insert --6,593,187 7/2003 Hsieh--
    insert --6,624,465 9/2003 Chien, et al.--
    insert --6,627,942 9/2003 Wang--
    insert --6,642,104 11/2003 Chang--
    insert --6,645,869 11/2003 Chu, et al.--
Column 13, line 2; delete "wit" insert --with--

Signed and Sealed this

Seventh Day of August, 2007

JON W. DUDAS
*Director of the United States Patent and Trademark Office*